United States Patent [19]

Wilson

[11] 4,009,752
[45] Mar. 1, 1977

[54] WARP-RESISTANT HEAT SINK

[75] Inventor: Edward Arthur Wilson, Phoenix, Ariz.

[73] Assignee: Honeywell Information Systems Inc., Phoenix, Ariz.

[22] Filed: Feb. 24, 1975

[21] Appl. No.: 552,494

[52] U.S. Cl. .............................. 165/81; 165/185; 357/81; 361/386
[51] Int. Cl.² ........................................ H01L 23/36
[58] Field of Search ............ 165/185, 183, 81, 182; 317/100; 357/81

[56] References Cited

UNITED STATES PATENTS

| 2,653,800 | 9/1953 | Anton | 165/182 X |
| 3,399,332 | 8/1968 | Savolainen | 357/81 |

FOREIGN PATENTS OR APPLICATIONS

| 629,909 | 8/1927 | France | 165/183 |

Primary Examiner—Albert W. Davis, Jr.
Attorney, Agent, or Firm—Edward W. Hughes; William W. Holloway, Jr.

[57] ABSTRACT

A warp-resistant heat sink suitable for soldering to one side of a relatively fragile, ceramic semiconductor substrate comprises a plate of heat-conducting material having a plurality of slits along two sides thereof, and a plurality of U-shaped heat-conducting members each of which extends through a respective one of the slits in the plate. The U-shaped heat-conducting members are soldered to the same side of the plate, the members along one edge of the plate being off-set with respect to the members along the opposite side of the plate in order to increase the heat transfer efficiency when air is forced through the heat sink. The plate material is selected so as to have a substantially identical thermal coefficient of expansion as that of the substrate material. When the heat sink plate is soldered to the substrate surface, a laminate is thereby formed comprising two outer layers of material having substantially identical thermal coefficients of expansion and an inner layer having a different thermal coefficient of expansion. Relatively large heat sinks can thus be fabricated which have a high resistance to the warpage which would otherwise result from the dissimilar thermal expansion and contraction of the ceramic substrate and the heat-conducting members.

4 Claims, 1 Drawing Figure

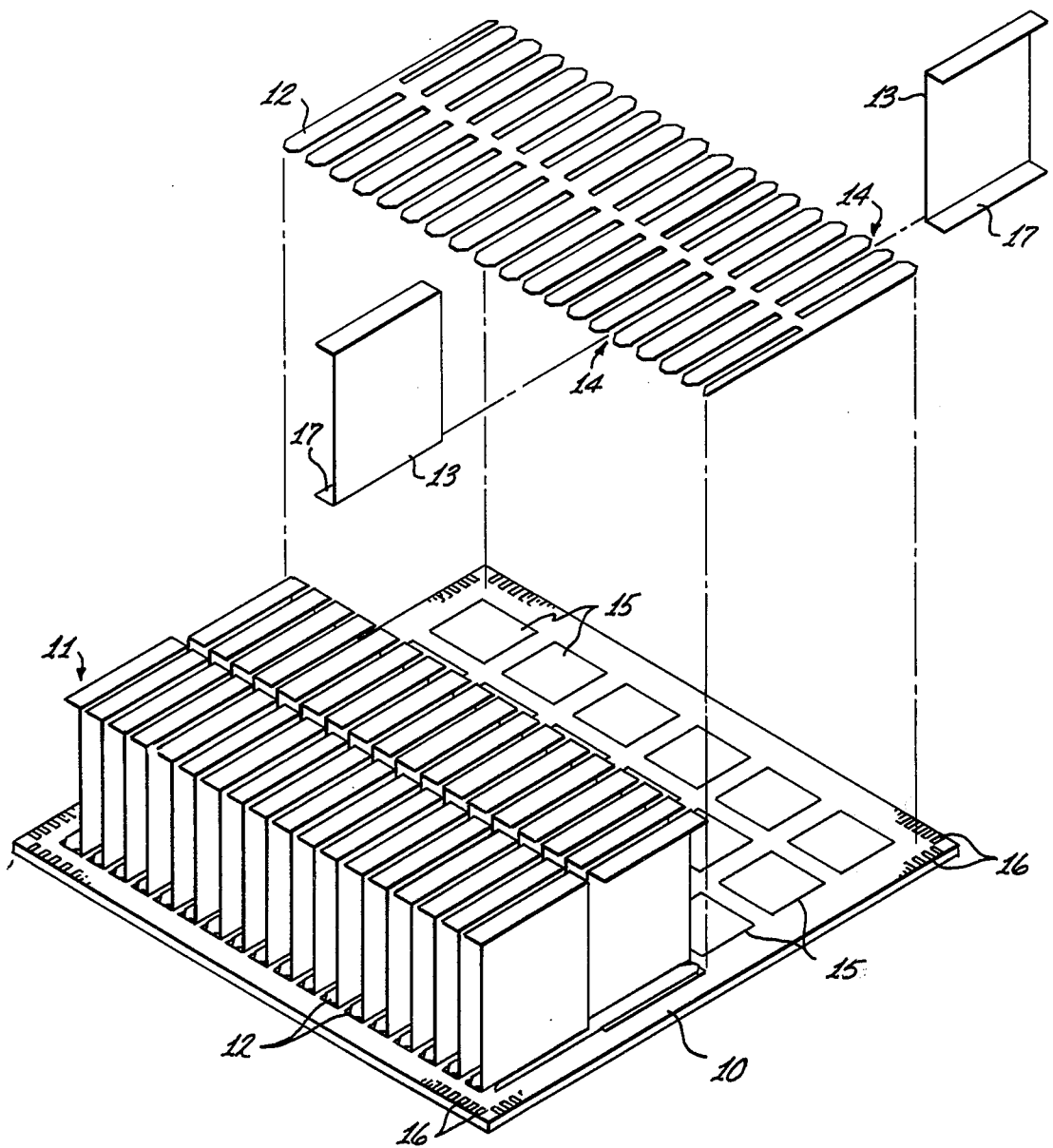

WARP-RESISTANT HEAT SINK

BACKGROUND OF THE INVENTION

The present invention relates generally to microelectronic circuit packaging apparatus, and, more particularly, to a warp-resistant heat sink suitable for soldering to a relatively fragile, ceramic semiconductor substrate.

In the microelectronic circuit packaging technology, there is a significant trend today towards the use of multilayer printed wiring boards, particularly of the ceramic type. Tens and hundreds of semiconductor chips may be mounted on one surface of such a substrate measuring, for example, several inches on a side. These microcircuits consume a relatively large amount of power, and accordingly generate considerable heat. As the packing densities of heat-generating microelectronic circuits become increasingly higher in order to achieve savings in component costs and increases in operating frequencies, there is greater need for effective heat dissipating mechanisms to ensure the operation of such circuits within prescribed limits. In order to prevent excessive heat build-up, and resultant damage to the microelectronic circuitry and packaging apparatus, it is necessary to artificially cool the substrate boards.

Heat sinks are familiar devices in the circuit packaging arts for dissipating excessive heat generated by operating electronic components to the ambient environment. It is known in the prior art to utilize metal fins soldered or otherwise fastened to electronic components or packaging boards to dissipate surplus heat. The ceramic substrates in current use in microelectronic circuit packaging technology, however, present particular problems regarding the design of compatible, efficient heat sinks. Such substrates are relatively fragile and will crack or break if subjected to undue mechanical or thermal stresses. Such substrates must also be capable of dissipating heat from substantially the entire surface area of one side thereof, since the opposite side of such substrates is ordinarily totally occupied by heat-generating microelectronic circuitry. The fact that the interior of such substrates comprises one or more networks of signal and power lines, which also generate heat, is another reason compelling the use of a large heat sink occupying substantially all of one side of the substrate.

While various metals have been used in heat sink fabrication, copper has been found to be an excellent choice, because of its heat conducting properties. Copper, however, has a thermal coefficient of expansion which is substantially different from that of the material used in the construction of ceramic substrates. For this reason, heat-dissipating copper fins of any appreciable size cannot safely be soldered or otherwise fixed to the ceramic substrate, since the heat warpage resulting from the dissimilar thermal ratios of the copper and ceramic material eventually causes sufficient mechanical stress on the ceramic material to crack or break it, resulting in damage to the conductive lines therein and failure of the circuit package.

During the fabrication step of soldering relatively large copper fins to a fragile ceramic substrate cracking or breaking is also likely to occur, because of the dissimilar rates of thermal contraction of copper and the ceramic material experienced as the package cools from the soldering temperature. Even if breakage does not occur as a result of excessive heating or cooling, the fins soldered to the substrate have a tendency to creep out of place under the influence of mechanical stress and to eventually become dislocated from the substrate, resulting in the need to remove and repair the microelectronic package.

Therefore, it is an object of the present invention to provide a warp-resistant heat sink suitable for mounting on a relatively fragile, ceramic substrate.

It is also an object of the present invention to provide a warp-resistant heat sink of approximately the same dimensions as the substrate to which it is mounted.

These and other objects of the present invention are achieved, according to one embodiment thereof, by providing a rectangular plate formed of a metal having a thermal coefficient of expansion substantially identical to that of the substrate material. Slit-like openings along opposite edges of the plate receive U-shaped, copper, heat-conducting members, which members are all soldered to the same side of the plate. The plate, in turn, is soldered to one surface of the substrate. The resulting laminate comprises two outer layers of material having substantially identical thermal coefficients of expansion and an inner layer of copper having a different thermal coefficient of expansion. As a consequence, the laminate has relatively symmetrical thermal expansion and contraction properties, and the warpage which would otherwise result from the bonding of two materials having dissimilar thermal coefficients of expansion is substantially reduced if not totally eliminated.

BRIEF DESCRIPTION OF THE DRAWING

The invention is pointed out with particularity in the appended claims; however, other objects and features of the invention will become more apparent and the invention itself will be best understood by referring to the following description and embodiments taken in conjunction with the accompanying drawing in which:

The sole FIGURE is a perspective view of a substrate having mounted at one end on one side thereof a fully assembled warp-resistant heat sink and further showing at the other end of the same side thereof an exploded view of the principal elements of a warp-resistant heat sink.

DETAILED DESCRIPTION OF THE PREFERRED EMBODIMENT

As shown in the sole FIGURE, a multilayer ceramic substrate 10, having for example the dimensions 80 mm × 80 mm, has mounted thereon a completely assembled warp-resistant heat sink 11 of approximate dimensions 71.0 mm × 37.5 mm. Although the substrate 10 forms no part of the present invention, it is appropriate to discuss certain features thereof herein. Substrate 10, approximately 1.0 mm to 2.0 mm in thickness, is formed of alumina (synthetic aluminum oxide) and comprises a plurality of alternating signal and dielectric layers. A plurality of input/output pads 16 (only several of which are shown) are disposed around the periphery of substrate 10. Also shown in the sole FIGURE, which depicts a portion of the underside only of substrate 10, are aluminum pads 15 formed as an integral part of the under surface of substrate of substrate 10. The aluminum pads 15 serve to increase the heat transfer rate between the internal portions of the alumina substrate 10 and the heat sink 11. Pads 15 also provide a suitable bonding surface to which a pair of heat sinks 11 may be soldered.

The sole FIGURE depicts in the foreground thereof a completely assembled warp-resistant heat sink 11 mounted on the surface of substrate 10. Also shown in the sole FIGURE is an exploded view of the constituent elements of the warp-resistant heat sink of the present invention. Normally, two such heat sinks are affixed side-by-side to the surface of substrate 10. It should be understood, however, that the number of heat sinks and the relative dimensions thereof with respect to the substrate dimensions are matters of design optimization and various modifications to the preferred embodiment may be made according to the desired heat dissipation requirements.

The actual composition and construction of the heat sink 11 will now be discussed with regard to the exploded view shown in the sole FIGURE. A plate 12 of generally rectangular shape has a pattern of slit-like openings 14 stamped or etched along opposing edges thereof. The slits 14 along one edge are offset with respect to those along the opposite edge. Slits 14 are normal to the edge of the plate 12 and extend inwardly nearly to the centerline of plate 12, leaving sufficient material along such centerline to provide adequate structural support while the heat sink 11 is being assembled. The outer portions of each slit 14 may be bevelled to facilitate insertion of a heat-conducting member 13. Plate 12, according to the preferred embodiment of the invention, is formed of Kovar, a trade name for an alloy of iron and nickel. The particular metal of which plate 12 is formed is selected to have a thermal coefficient of expansion substantially identical to that of the alumina substrate 10.

Heat-conducting members 13 are preferably formed of copper, because of the superior heat-dissipating properties of copper. Members 13 are shown to be generally U-shaped in the preferred embodiment; however, it will be understood that alternative shapes, for example L-shaped or Z-shaped, may be used to implement the present invention. Regardless of the particular shape selected, it is important to provide a foot or flange 17 along one side of member 13 for the purpose of securing same to the underside of plate 12. As shown in the exploded view of the sole FIGURE, the U-shaped members 13 are inserted in the slots 14 of plate 12.

Referring now to the completely assembled heat sink 11, it will be seen that the U-shaped members 13 inserted into the slots 14 along one edge of plate 12 all face in the same direction and are all secured to the same side of plate 12 (i.e., the underside of plate 12). The U-shaped members 13 disposed along the opposite portion of plate 12 likewise are all secured to the underside of plate 12 and uniformly face in the opposite direction from those members 13 which are disposed along the first portion of plate 12.

When the U-shaped heat-conducting members 13 have been properly assembled into plate 12, they are soldered to the underside of plate 12 using a known flow-soldering technique. The integral heat sink 11 may then be properly positioned relative to the surface of substrate 10 and flow-soldered to same.

The resulting structure comprises a laminate having two outer layers, namely the Kovar plate 12 and alumina substrate 10, having substantially identical thermal coefficients of expansion and an inner layer, namely the foot or flange 17 of the copper U-shaped member 13, having a significantly different thermal coefficient of expansion. The resultant laminate is substantially more resistant to warpage and breakage as a result of thermal expansion or contraction than known prior art structures. Of further significance is the fact that the disclosed heat sink is capable of utilizing the superior heat-dissipating properties of copper and is therefore able to satisfy the high density, high power, and high operational frequency requirements which are prescribed by current micro-electronic circuit packaging technology.

The offsetting of alternate rows of U-shaped members 13 is desirable when air is to be forced through the heat sink structure. Were the vertical portions of consecutive U-shaped members 13 to be perfectly aligned, a high temperature boundary layer would eventually form at some point along the air channel, resulting in inefficient heat dissipation from those portions of the contiguous U-shaped members beyond such point in the air stream. By staggering the members 13 along the air stream, the air stream is directed against the vertical portion of each successive U-shaped member in a manner which inhibits the formation of a boundary layer condition.

It will be apparent to those skilled in the art that the disclosed Warp-Resistant Heat Sink may be modified in numerous ways and may assume many embodiment other than the preferred form specifically set out and described above. Accordingly, it is intended by the appended claims to cover all modifications of the invention which fall within the true spirit and scope of the invention.

What is claimed is:

1. A warp-resistant heat sink suitable for soldering to a relatively fragile, ceramic semiconductor substrate, wherein said heat sink comprises a rectangular heat-conducting plate having a plurality of slit-like openings along opposite edges thereof, said openings being normal to the edges, the openings along one edge being offset with respect to those along the opposite edge, said plate having a thermal coefficient of expansion substantially identical to that of said ceramic substrate;

a plurality of U-shaped heat-conducting members, each of said members extending through a respective one of said openings in said plate, the members which extend through the openings along one edge of said plate all having an identical orientiation and the members which extend through the openings along the opposite edge of said plate all having an identical orientation, the orientation of the members along one side being different from that of the members along the opposite side, one side of each of said members being secured to the same side of said plate, said members being formed of material having a different thermal coefficient of expansion than said plate, whereby when said heat sink plate is soldered to said substrate the laminate thereby formed comprises two outer layers of material having substantially identical thermal coefficients of expansion and an inner layer having a different theremal coefficient of expansion.

2. The heat sink according to claim 1, wherein said plate is comprised of Kovar, and said members are comprised of copper.

3. An air-cooled heat sink, comprising a rectangular plate having a plurality of slit-like openings along opposite edges thereof, said openings being normal to the edges, the openings along one edge being offset with respect to those along the opposite edge;

a plurality of U-shaped heat-conducting members, each of said members extending through a respective one of said openings in said plate, the members along one edge all having an identical orientation and the members along the opposite edge all having an identical orientation, the orientation of the members along one edge being different from that of the members along the opposite edge, one side of each of said members being secured to the same side of said plate, whereby when air is directed through the members which are arranged along one edge of the plate the heat transfer efficiency of the heat sink is substantially increased as a result of inhibiting the formation of a thermal boundary layer along the members which are arranged along the opposite edge of the plate.

4. The heat sink according to claim 3, wherein said plate is comprised of Kovar, and said members are comprised of copper.

* * * * *